(12) United States Patent
Tagade et al.

(10) Patent No.: US 10,324,139 B2
(45) Date of Patent: Jun. 18, 2019

(54) METHOD AND ELECTRONIC DEVICE FOR DETECTING INTERNAL SHORT CIRCUIT IN BATTERY

(71) Applicant: Samsung Electronics Co., Ltd., Suwon-si, Gyeonggi-do (KR)

(72) Inventors: Piyush Tagade, Bengaluru (IN); Ashish Khandelwal, Bengaluru (IN); Krishnan Seethalakshmy Hariharan, Bengaluru (IN); Aravinda Reddy Mandli, Bengaluru (IN); Sanoop Ramachandran, Bengaluru (IN); Ankit Yadu, Bangalore (IN); Periyasamy Paramasivam, Bangalore (IN); Dough Heun Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/855,868

(22) Filed: Dec. 27, 2017

(65) Prior Publication Data

US 2018/0180680 A1 Jun. 28, 2018

(30) Foreign Application Priority Data

Dec. 27, 2016 (IN) .............................. 201641044470
Dec. 22, 2017 (IN) .............................. 201641044470

(51) Int. Cl.
*G08B 21/00* (2006.01)
*G01R 31/389* (2019.01)
(Continued)

(52) U.S. Cl.
CPC ......... *G01R 31/389* (2019.01); *G01R 31/371* (2019.01); *G01R 31/392* (2019.01); *G08B 21/185* (2013.01); *G01R 31/025* (2013.01)

(58) Field of Classification Search
CPC ............ G01R 31/3662; G01R 31/3689; G01R 31/392; G01R 31/371; G01R 31/025; G08B 21/185; H02J 7/0047; H02J 2007/005
(Continued)

(56) References Cited

U.S. PATENT DOCUMENTS

| 4,242,734 A | 12/1980 | Deal |
| 4,379,990 A | 4/1983 | Sievers et al. |

(Continued)

FOREIGN PATENT DOCUMENTS

| EP | 1463144 B1 | 8/2010 |
| JP | 2006-098135 A | 4/2006 |
| KR | 10-2004-0014921 A | 2/2004 |

OTHER PUBLICATIONS

International Search Report dated Apr. 19, 2018 in connection with International Patent Application No. PCT/KR2017/015529.
(Continued)

*Primary Examiner* — Anh V La

(57) ABSTRACT

Embodiments herein provide a method and electronic device for detecting an internal short circuit in a battery. The method includes obtaining, by a battery management system, battery gauge data. Further, the method includes estimating, by the battery management system, an internal resistance of the battery using the battery gauge data. Furthermore, the method includes detecting, by the battery management system, the internal short circuit in the battery by comparing a change in the internal resistance with a pre-defined resistance change threshold value.

20 Claims, 14 Drawing Sheets

(51) Int. Cl.
G08B 21/18 (2006.01)
G01R 31/371 (2019.01)
G01R 31/392 (2019.01)
G01R 31/02 (2006.01)

(58) Field of Classification Search
USPC ........ 340/636.1, 635, 636.17, 636.19, 636.2; 320/134, 136, 107, 157, 116
See application file for complete search history.

(56) References Cited

U.S. PATENT DOCUMENTS

| | | | |
|---|---|---|---|
| 5,339,017 A * | 8/1994 | Yang | G01R 31/3662 320/127 |
| 6,442,494 B1 * | 8/2002 | Baalu | G01R 31/3665 324/528 |
| 6,563,318 B2 | 5/2003 | Kawakami et al. | |
| 7,557,724 B2 | 7/2009 | Breitling et al. | |
| 9,570,781 B2 | 2/2017 | Saunders et al. | |
| 2002/0057340 A1 * | 5/2002 | Fernandez | G08B 13/19608 348/143 |
| 2013/0207592 A1 | 8/2013 | Okada | |
| 2015/0155605 A1 | 6/2015 | Dvorsky et al. | |
| 2016/0103188 A1 * | 4/2016 | Eifert | B60L 11/1861 324/435 |
| 2018/0087790 A1 * | 3/2018 | Perez | F24F 2110/00 |

OTHER PUBLICATIONS

Written Opinion of the International Searching Authority dated Apr. 19, 2018 in connection with International Patent Application No. PCT/KR2017/015529.

* cited by examiner

METHOD AND ELECTRONIC DEVICE FOR DETECTING INTERNAL SHORT CIRCUIT IN BATTERY

CROSS-REFERENCE TO RELATED APPLICATIONS AND CLAIM OF PRIORITY

This application is related to and claims priority to from Indian Patent Application No. 201641044470, filed on Dec. 27, 2016 and Indian Patent Application No. 201641044470, filed on Dec. 22, 2017, the contents of which are incorporated herein by reference.

TECHNICAL FIELD

The present disclosure relates to battery management systems. More particularly, the present disclosure relates to a method and electronic device detecting internal short circuit in a battery.

BACKGROUND

Batteries are made of one or more cells, for example, lithium-ion cells or lithium-air cells, and are used to power many different types of devices. Rechargeable lithium batteries are attractive energy storage devices for portable electric and electronic devices. As the energy of batteries continues to rise, the potential for serious failures becomes a concern. Due to manufacturing variability, extreme operating conditions, exploitative usage and so on, a battery of the electronic may develop faults.

Catastrophic battery failure may include a thermal runaway event in which an internal short circuit inside a cell initiates a self-accelerating decomposition reaction inside the cell. The thermal runaway events may include smoke, flames, or even an explosion if an intervention is not performed in a timely manner.

In conventional systems, various mechanisms are available to detect short circuits in cells by monitoring cell voltages.

Voltage of a cell is monitored over time when there is no charge or discharge current flowing in the cell. A drop or decline in cell voltage beyond a certain value can indicate the presence of an internal short in the cell, thus allowing the cell to be rejected as faulty cell. However, such voltage tests do not identify cells that will develop internal short circuits later in their life cycle, which may lead to catastrophic failures of cells that develop internal short circuits during operation. Early detection of the fault is essential to ensure safe operation of the battery. Detection of fault inception due to battery internal short is difficult due to lack of prior information.

The above information is presented as background information only to help the reader to understand the present invention. Applicants have made no determination and make no assertion as to whether any of the above might be applicable as Prior Art with regard to the present application.

SUMMARY

The principal object of the embodiments herein is to provide a method and electronic device for detecting internal short circuit in a battery.

Another object of the embodiments herein is to estimate an internal resistance of the battery using battery gauge data such as voltage, current and temperature and so on.

Another object of the embodiments herein is to apply Haar transform on the estimated internal resistance to measure discontinuity in the internal resistance during a charge-discharge transition.

Another object of the embodiments herein is to identify a magnitude of change in the internal resistance based on the Haar transform.

Another object of the embodiments herein is to compare a change in the internal resistance of the battery with a pre-defined resistance change threshold value to detect the internal short circuit in the battery.

Another object of the embodiments herein is to indicate the detected short circuit in the battery to a user.

Another object of the embodiments herein is to provide an alert message to the user about failure of the battery.

Another object of the embodiments herein is to provide an indication to the user about scheduling replacement of the battery.

Another object of the embodiments herein is to indicate the user about safety limit of charging the battery according to a minimum voltage.

Another object of the embodiments herein is to determine a fault index value of a plurality of batteries.

Another object of the embodiments herein is to identify the plurality of batteries as faulty batteries by comparing the fault index value with a pre-defined fault index value.

Accordingly embodiments herein provide a method for detecting an internal short circuit in a battery. The method includes obtaining, by a battery management system, battery gauge data. Further, the method includes estimating, by the battery management system, an internal resistance of the battery using the battery gauge data. Furthermore, the method includes detecting, by the battery management system, the internal short circuit in the battery by comparing a change in the internal resistance with a pre-defined resistance change threshold value.

Accordingly the embodiments herein provide a method for detecting an internal short circuit in a battery. The method includes obtaining battery gauge data from each battery among a plurality of batteries. The method includes estimating an internal resistance of each battery using the battery gauge data. The method includes detecting the internal short circuit in the battery by comparing a change in the internal resistance with a pre-defined resistance change threshold value. Further, the method includes determining a fault index value of a plurality of batteries. Furthermore, the method includes identifying the plurality of batteries as faulty batteries by comparing the fault index value with a pre-defined fault index value.

Accordingly the embodiments herein provide an electronic device for detecting an internal short circuit in a battery. The electronic device includes a battery management system configured to obtain battery gauge data. Further, the battery management system configured to estimate an internal resistance of the battery using the battery gauge data. The internal resistance is estimated based on a filtering technique applied to an electrochemical model. Furthermore, the battery management system configured to detect the internal short circuit in the battery by comparing a change in the internal resistance with a pre-defined resistance change threshold value.

Accordingly the embodiments herein provide an electronic device for detecting an internal short circuit in a battery. The electronic device includes a battery management system configured to obtain battery gauge data from each battery among a plurality of batteries. The battery management system configured to estimate an internal resistance of each battery using the battery gauge data. The internal resistance is estimated based on a filtering technique applied to an electrochemical model. The battery management system configured to detect the internal short circuit in the battery by comparing a change in the internal resistance with a pre-defined resistance change threshold value. Further, the battery management system configured to determine a fault index value of a plurality of batteries. Furthermore, the battery management system configured to identify the plurality of batteries as faulty batteries by comparing the fault index value with a pre-defined fault index value.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

This method is illustrated in the accompanying drawings, throughout which like reference letters indicate corresponding parts in the various figures. The embodiments herein will be better understood from the following description with reference to the drawings, in which.

DETAILED DESCRIPTION

Figure 1:
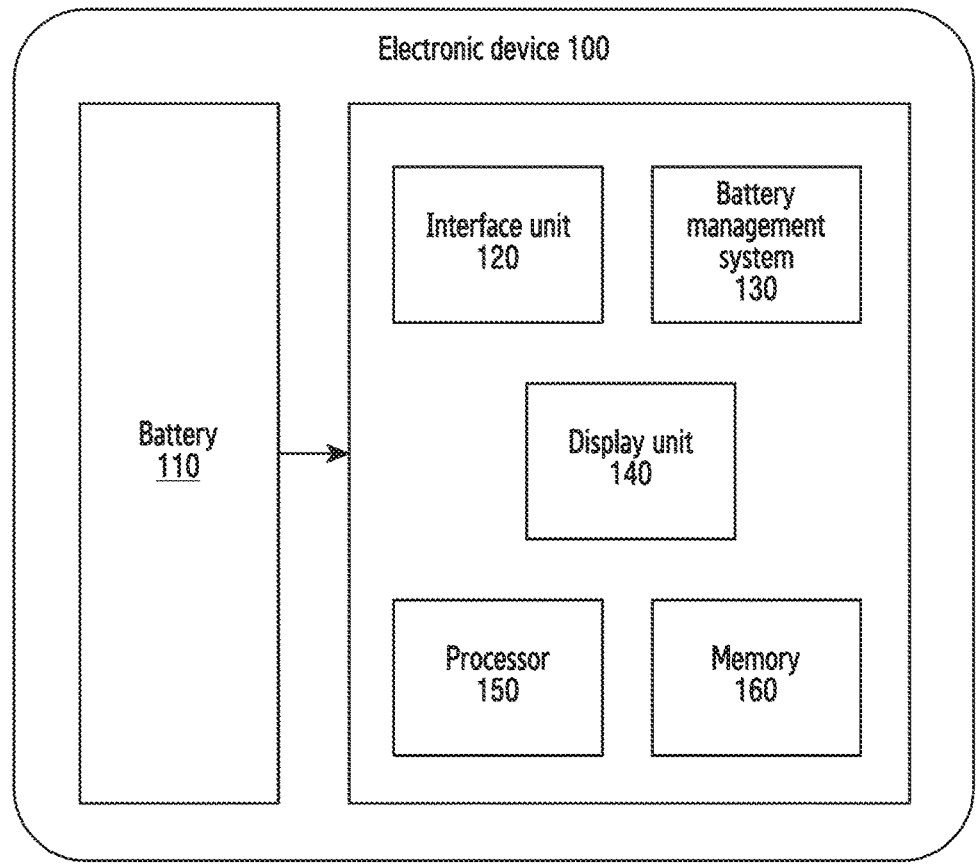
FIG. 1 is a block diagram illustrating various hardware elements of an electronic device, according to an embodiment as disclosed herein.

Various embodiments of the present disclosure will now be described in detail with reference to the accompanying drawings. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness.

Also, the various embodiments described herein are not necessarily mutually exclusive, as some embodiments can be combined with one or more other embodiments to form new embodiments. Herein, the term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is tradition in the field, embodiments may be described and illustrated in terms of blocks which carry out a described function or functions. These blocks, which may be referred to herein as managers, units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The embodiments herein provide a method for detecting an internal short circuit in a battery. The method includes obtaining, by a battery management system, battery gauge data. Further, the method includes estimating, by the battery management system, an internal resistance of the battery using the battery gauge data. The internal resistance is estimated based on a filtering technique applied to an electrochemical model. Furthermore, the method includes detecting, by the battery management system, the internal short circuit in the battery by comparing a change in the internal resistance with a pre-defined resistance change threshold value.

Unlike conventional systems and methods, the proposed system and method can be used for early detection of the internal short circuit in the battery. The proposed method does not require additional hardware or modification of existing hardware in the electronic device. The proposed method can be combined with any state of the art electrochemical battery model for estimating the internal resistance of the battery and to determine the internal short circuit in the battery. The proposed method can be used on board for internal short detection in real time.

Unlike conventional systems and methods, the proposed method can be used to measure change or variation or discontinuity in the internal resistance (during a charge-discharge transition) by applying the Haar transform on estimated internal resistance signal of the battery. The Haar transform localizes and magnifies the internal resistance signal of the battery. The coefficients of the Haar transform are determined, for example using a Fast Haar Transform. Further, the peaks of the Haar transform coefficients are used for the internal short circuit detection in the battery.

In an embodiment, the battery gauge data is stored periodically during charge-discharge transition for detecting the internal short circuit in the battery.

In another embodiment, the battery gauge data is periodically transmitted to a server for indicating the internal short circuit in the battery.

In an embodiment, the proposed method includes indicating the detected internal short circuit in the battery on the screen of the electronic device.

In an embodiment, the proposed method includes indicating the user to schedule replacement of the battery for optimal performance.

In some embodiments, the proposed method includes transmitting an indication about the detected short circuit to one or more connected devices of the user.

In various embodiments, the detection of internal short circuit is performed on a plurality of batteries for identifying the faulty batteries among the plurality of batteries. The method includes obtaining battery gauge data from each battery among a plurality of batteries. The method includes obtaining battery gauge data from each battery among a plurality of batteries. The method includes estimating an internal resistance of each battery using the battery gauge data. The internal resistance is estimated based on a filtering technique applied to an electrochemical model. The method includes detecting the internal short circuit in the battery by comparing a change in the internal resistance with a pre-defined resistance change threshold value. Further, the method includes determining a fault index value of a plurality of batteries. Furthermore, the method includes identifying the plurality of batteries as faulty batteries by comparing the fault index value with a pre-defined fault index value.

Unlike conventional systems and methods, the proposed method can be used for testing the batteries in a batch to identify faulty batteries in the batch. The proposed method of internal short detection is performed on the batteries to identify the faulty batteries from the plurality of batteries.

Further, the proposed method can be used to indicate the faulty batteries among the plurality of batteries and various statistical data related to number of cycles between the fault detection and the battery failure.

Referring now to the drawings, and more particularly to FIGS. 1 through 8C, there are shown preferred embodiments.

FIG. 1 is a block diagram illustrating various hardware elements of an electronic device 100, according to an embodiment as disclosed herein.

In an embodiment, the electronic device 100 can be, for example, a mobile phone, a smart phone, a laptop, a desktop computer Personal Digital Assistants (PDAs), a tablet, a phablet, a consumer electronic device, a dual display device, edge display, or any other electronic device. In another embodiment, the electronic device 100 can be a wearable device such as, for example, a smart watch, a smart bracelet, a smart glass, or the like. In yet another embodiment, the electronic device 100 can be Internet of things (IoT) device.

The electronic device 100 includes a battery 110, an interface unit 120, and a battery management system 130. Further, the electronic device 100 includes (or, be associated with), a display unit 140 (e.g., a Cathode Ray Tube (CRT) display, a Liquid Crystal Display (LCD), Organic Light-Emitting Diode (OLED), a Light-emitting diode (LED), etc.), being interfaced with a processor 150 (e.g., Central processing unit (CPU), Graphics processing unit (GPU), hardware chipset, etc.) communicatively coupled to a memory 160 (e.g., a volatile memory and/or a non-volatile memory). The memory 160 includes storage locations configured to be addressable through the processor 150.

In an embodiment, the battery 110 can be for e.g., a rechargeable battery with a predefined capacity set by the battery manufacturer or Original Equipment Manufacturer (OEM). The characteristics of the battery 110 (provided by the battery manufacturer/OEM) includes, for e.g., type of battery (e.g., Lithium), total capacity (mAh) of the battery 110, constant current rate, nominal voltage level, charge allowance capacity, preset charge capacity, rated capacity of the battery, charge limit voltage, discharge limit voltage, maximum continuous charge current, max continuous discharge current, initial impedance, charging/discharging life cycles, or the like.

The interface unit 120 can be configured to communicate with the battery 110 to continuously receive the battery gauge data (i.e., a plurality of battery parameters). Further, the battery management system 130 can be configured to communicate with the interface unit 120 to extract the plurality of battery parameters.

In an embodiment, the battery management system 130 can be integrated with the battery 110 (e.g., battery management system chipset). The battery management system 130 can be configured to determine the internal resistance of the battery 110 using the battery gauge data. It should be noted that the internal resistance is estimated using any conventional electrochemical battery model and a filtering technique is applied to the estimated internal resistance to remove the noise in the internal resistance signal.

Further, the battery management system 130 can be configured to apply the Haar transform on the internal resistance of the battery 110. The Haar transform localizes and magnifies the internal resistance signal. The coefficients of the Haar transform are determined using a Fast Haar Transform. The battery management system 130 utilizes the peaks of the Haar transform coefficients for the internal short circuit detection in the battery 110. The battery management system 130 can be configured to perform one or more actions to detect the internal short circuit in the battery as detailed in conjunction with the FIG. 2.

The display unit 140 can be configured to indicate the detected internal short circuit on the screen of the electronic device. Further, the display unit 140 can be configured to indicate one or more battery parameters such as battery usage interval, battery charge indication, present state of the battery, battery indicator (i.e., graphical, percentage, etc.), remaining battery, battery status, battery drain notifications, etc.

The processor 150 can be configured to communicate with all the hardware elements in the electronic device 100 to perform the functionalities of the corresponding elements.

In an embodiment, the battery gauge data is stored periodically during charge-discharge transition in the memory 160 for detecting the internal short circuit in the battery. The memory 160 may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory 160 may, in some examples, be considered a non-transitory storage medium. However, the term "non-transitory" should not be interpreted that the memory 160 is non-movable. In some examples, the memory 160 can be configured to store larger amounts of information than the memory. In certain examples, a non-transitory storage medium may store data that can, over time, change (e.g., in Random Access Memory (RAM) or cache).

Figure 2:
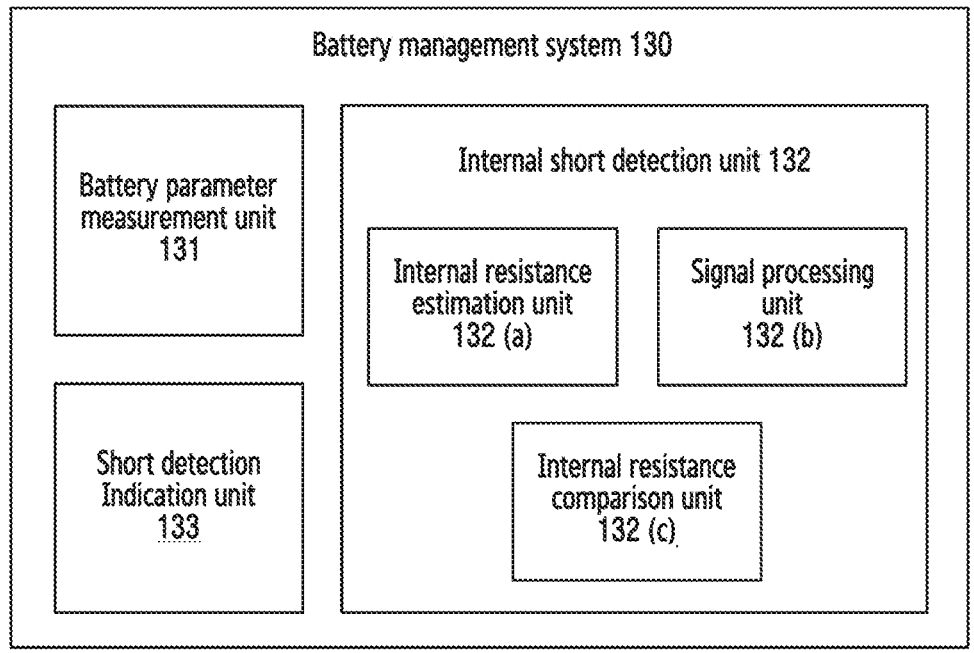
FIG. 2 is a block diagram illustrating various hardware elements of a battery management system, according to an embodiment as disclosed herein.

FIG. 2 is a block diagram illustrating various hardware elements of a battery management system 130, according to an embodiment as disclosed herein.

Referring to FIG. 2, the battery management system 130 includes a battery parameter measurement unit 131, an internal short detection unit 132 and a short detection indication unit 133.

The battery parameter measurement unit 131 can be configured to measure the battery gauge data (i.e., the plurality of battery parameters). In an embodiment, the plurality of battery parameters include for e.g., voltage, current, temperature, total battery capacity, an internal impedance, a state of charge of the battery, a number of charging cycles, a number of discharging cycles, a discharge capacity, usage information of the electronic device 100, and usage information of each application installed in the electronic device 100, or the like.

Further, the battery parameter measurement unit 131 can be configured to measure the present temperature of the electronic device 100/battery 110. In an embodiment, the temperature is measured/determined by; monitoring temperature of the electronic device 100/monitoring temperature of the battery 110, an ambient temperature of the electronic device 100/battery 110, a current consumption and a charging temperature of the electronic device 100/battery 110, or the like.

The battery parameter measurement unit 131 can be configured to transmit battery gauge data (i.e., the measured battery parameters, corresponding temperature, voltage and total charge) to the internal short detection unit 132.

The internal short detection unit 132 includes an internal resistance estimation unit 132(a), a signal processing unit 132(b), and an internal resistance comparison unit 132(c).

In an embodiment, the internal resistance estimation unit 132(a) can be configured to estimate the internal resistance of the battery using the battery gauge data. The internal resistance is estimated based on the filtering technique applied to an electrochemical model. The internal resistance is estimated using Scalar Kalman Filter method applied to the electrochemical model, using the battery gauge data.

In an embodiment, three parameters reduced order model (S3ROM) is used as the battery model.

$$V_{cell} = V_{ocv}(SOC) - IR_0 - \frac{R_g T}{\alpha F}\sinh^{-1}\left(\frac{I}{2I_N}\right) - \frac{R_g T}{\alpha F}\sinh^{-1}\left(\frac{I}{2I_P}\right)$$

In an embodiment, least square error minimization is used for parameter estimation. The least square minimization of model prediction facilitates robust and consistent prediction.

Further, a scalar Kalman Filter is used for estimation of the internal resistance of the battery 110.

The signal processing unit 132(b) can be configured to apply Haar transform on the estimated internal resistance of the battery 110 to measure discontinuity in the internal resistance during a charge-discharge transition. The charge-discharge transition denotes the state in which the electronic device 100 is unplugged from charging, where as the discharge to charge transition indicates the state in which the electronic device 100 is plugged for charging. The signal processing unit 132(b) can be configured to apply Haar transform on the estimated internal resistance of the battery at the charge-discharge transition.

Unlike to conventional methods and conventional systems, the proposed method can be used to measure discontinuity in the internal resistance during a charge-discharge transition by applying the Haar transform on the estimated internal resistance of the battery 110.

Further, the signal processing unit 132(b) can be configured to identify the magnitude of the change in the internal resistance based on the applied Haar transform. When Haar transform is applied on the internal resistance, the magnitude of the change in the internal resistance of the battery can be determined. In an embodiment, the signal processing unit 132(b) can be configured to determine a second Haar coefficient of the internal resistance signal for identifying the magnitude of the change in the internal resistance of the battery 110 for detecting the internal short circuit in the battery 110.

In an embodiment, the signal processing unit 132(b) can be configured to determine the likelihood ratio, using the second Haar coefficient (h2) denoted as $$L = \frac{N(h2; \mu F, \sigma F)}{N(h2; \mu F, \sigma F)}$$

The internal resistance comparison unit 132(c) can be configured to compare the magnitude of change in internal resistance with the pre-determined resistance change threshold value. For example, the pre-determined resistance change threshold value can be 0.5. The internal resistance comparison unit 132(c) can be configured to determine whether the magnitude of change in internal resistance is less than 0.5. In case, when the internal resistance comparison unit 132(c) determines that the magnitude of change in internal resistance is less than 0.5, then the internal resistance comparison unit 132(c) detects the internal short circuit in the battery 110. It should be noted that the pre-determined resistance change threshold value can be for example, 0.5 for a healthy battery and for a faulty battery, the magnitude of change in internal resistance is less than 0.5. Thus, the internal resistance comparison unit 132(c) can be configured to compare the magnitude of change in internal resistance with the pre-determined resistance change threshold value to detect the internal short circuit in the battery.

In an embodiment, the short detection indication unit 133 can be configured to indicate the detected short circuit to the user. For example, the short detection indication unit 133 can be configured to generate an alert message to the user indicating the detected short circuit in the battery. In some embodiments, the short detection indication unit 133 can be configured to perform one or more actions to indicate the detected short circuit to the user, as explained in conjunction with FIGS. 5A-5E.

Figure 3:
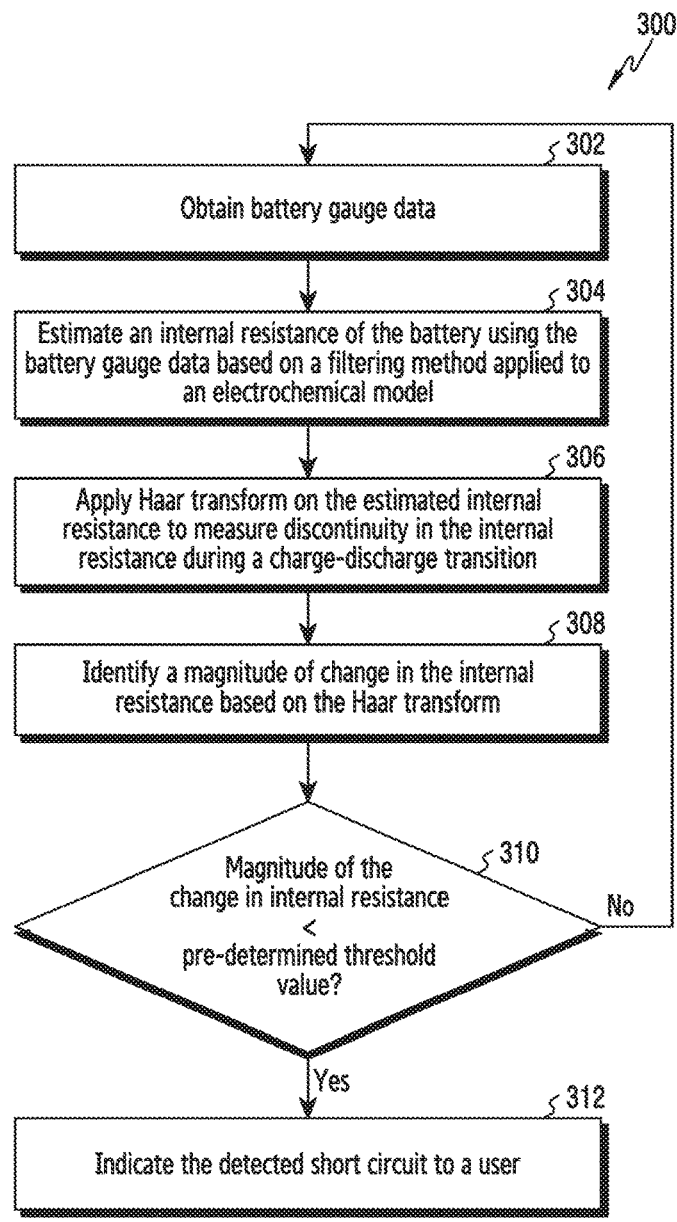
FIG. 3 is a flow chart illustrating a method for detecting an internal short circuit in a battery, according to an embodiment as disclosed herein.

FIG. 3 is a flow chart 300 illustrating a method for detecting an internal short circuit in a battery, according to an embodiment as disclosed herein.

Referring to the FIG. 3, at step 302, the method includes obtaining the battery gauge data (i.e., the plurality of battery measurement parameters). In an embodiment, the method allows the battery management system 130 to obtain the battery gauge data.

At step 304, the method includes estimating the internal resistance of the battery using the battery gauge data based on the filtering technique applied to the electrochemical model. In an embodiment, the method allows the battery management system 130 to estimate the internal resistance of the battery 110 using the battery gauge data based on the filtering technique applied to the electrochemical model.

At step 306, the method includes applying the Haar transform on the estimated internal resistance to measure discontinuity in the internal resistance during a charge-discharge transition. In an embodiment, the method allows the battery management system 130 to apply the Haar transform on the estimated internal resistance to measure change or variation or discontinuity in the internal resistance during a charge-discharge transition.

Unlike conventional systems and methods, the proposed method can be used to measure discontinuity in the internal resistance during a charge-discharge transition by applying the Haar transform on estimated internal resistance signal of the battery. The Haar transform localizes and magnifies the internal resistance signal of the battery. The coefficients of the Haar transform are determined, for example using a Fast Haar Transform. Further, the peaks of the Haar transform coefficients are used for the internal short circuit detection in the battery.

At step 308, the method includes identifying the magnitude of the change in the internal resistance based on the Haar transform. In an embodiment, the method allows the battery management system 130 to identify the magnitude of the change in the internal resistance based on the Haar transform.

At step 310, the method includes determining whether the magnitude of the change in the internal resistance is less than the pre-determined resistance change threshold value. In an embodiment, the method allows the battery management system 130 to determine whether the magnitude of the change in the internal resistance is less than the pre-determined resistance change threshold value.

In case, it is determined that the magnitude of the change in the internal resistance is less than the pre-determined resistance change threshold value, then at step 312, the method includes indicating the detected short circuit in the battery 110 to the user. In an embodiment, the method allows the battery management system 130 to indicate the detected short circuit in the battery 110 to the user.

In case, it is determined that the magnitude of the change in the internal resistance is greater than the pre-determined resistance change threshold value, then the method loops back to step 302.

Unlike conventional systems and methods, the proposed system and method can be used for early detection of the internal short circuit in the battery.

The various actions, acts, blocks, steps, or the like in the flow diagram 300 may be performed in the order presented, in a different order or simultaneously. Further, in some embodiments, some of the actions, acts, blocks, steps, or the like may be omitted, added, modified, skipped, or the like without departing from the scope of the invention.

Figure 4:
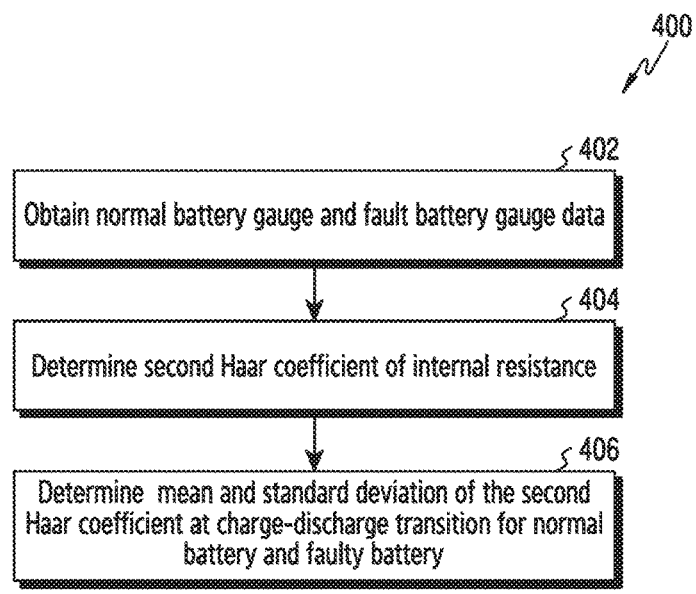
FIG. 4 is a flow chart illustrating a method for determining a pre-determined threshold value for detecting the battery internal short circuit in the battery, according to an embodiment as disclosed herein.

FIG. 4 is a flow chart 400 illustrating a method for determining a pre-determined resistance change threshold value for detecting the battery internal short circuit in the battery, according to an embodiment as disclosed herein.

Referring to the FIG. 4, in order to obtain the pre-determined resistance change threshold value, initially, at step 402, the method includes obtaining normal battery gauge data and faulty battery gauge data which includes battery parameters such as for e.g., voltage, current, temperature, total battery capacity, an internal impedance, a state of charge of the battery, a number of charging cycles, a number of discharging cycles, a discharge capacity, usage information of the electronic device 100, and usage information of each application installed in the electronic device 100, or the like. It should be noted that these battery parameters are obtained for normal battery and the faulty battery. In an embodiment, the method allows the battery management system 130 to obtain normal battery gauge data and the faulty battery gauge data.

At step 404, the method includes determining the second Haar coefficient of internal resistance for the normal battery gauge data and the faulty battery gauge data. In an embodiment, the method allows the battery management system 130 to determine second Haar coefficient of internal resistance for the normal battery gauge data and the faulty battery gauge data.

At step 406, the method includes determining mean and standard deviation of the second Haar coefficient at charge-discharge transition for the normal battery and the faulty battery. In an embodiment, the method allows the battery management system 130 to determine the mean and standard deviation of the second Haar coefficient at charge-discharge transition for the normal battery and the faulty battery. The ratio of the second Haar coefficient for the normal battery and the second Haar coefficient for the faulty battery denotes the pre-defined resistance change threshold value.

The various actions, acts, blocks, steps, or the like in the flow diagram 400 may be performed in the order presented, in a different order or simultaneously. Further, in some embodiments, some of the actions, acts, blocks, steps, or the like may be omitted, added, modified, skipped, or the like without departing from the scope of the invention.

FIGS. 5A-5E are example illustrations in which the electronic device 100 indicates the detected internal short circuit in the battery, according to an embodiment as disclosed herein.

Figure 5A:
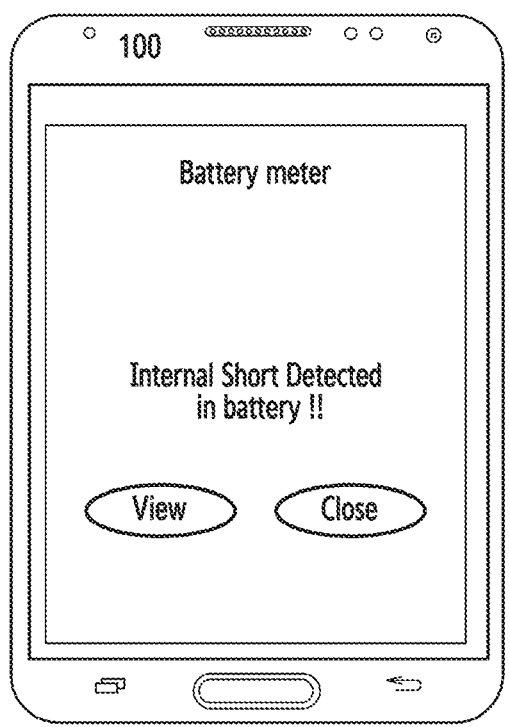
FIGS. 5A-5E are example illustrations in which the electronic device indicates the detected internal short circuit in the battery, according to an embodiment as disclosed herein.

Referring to the FIG. 5A, the electronic device 100 indicates the detected internal short circuit in the battery on the screen of the electronic device 100. The user can view the details of the detected short circuit by interacting with the view button.

Figure 5B:
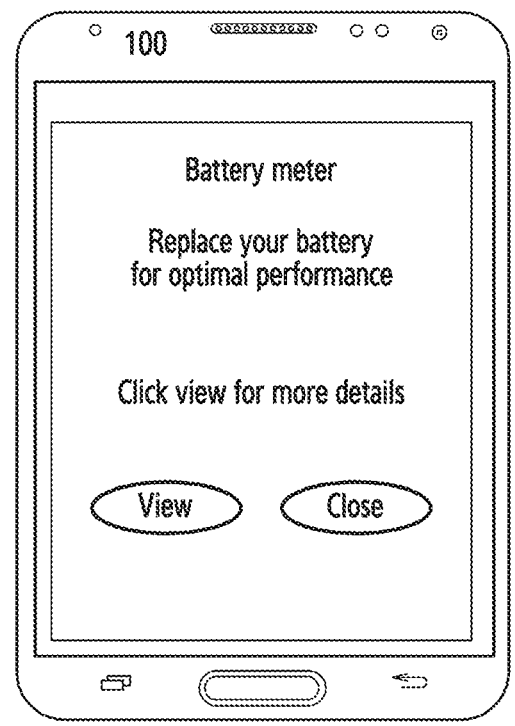

In another embodiment, after detecting the internal short circuit, the electronic device 100 indicates the user to replace the battery for optimal performance as shown in the FIG. 5B. Further, the user can view the details about the performance of the battery by interacting with the view button.

Figure 5C:
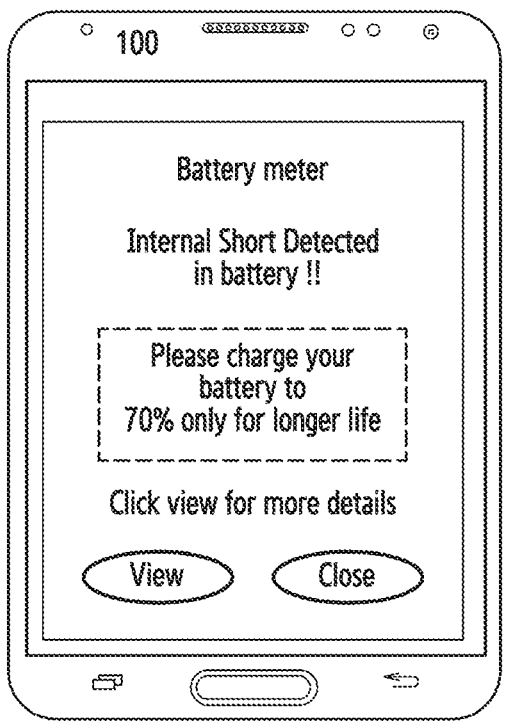

In another embodiment, the electronic device 100 indicates the detected internal short circuit in the battery 110 and suggests the user to charge the battery 110 up to 70% to ensure longer battery life as shown in the FIG. 5C. Thus, the electronic device 100 indicates safety limit of charging the battery 110 to the user as shown in the FIG. 5C by suggesting the user to charge the battery 110 to a certain level according to a voltage level, for example 4.1 V.

Figure 5D:
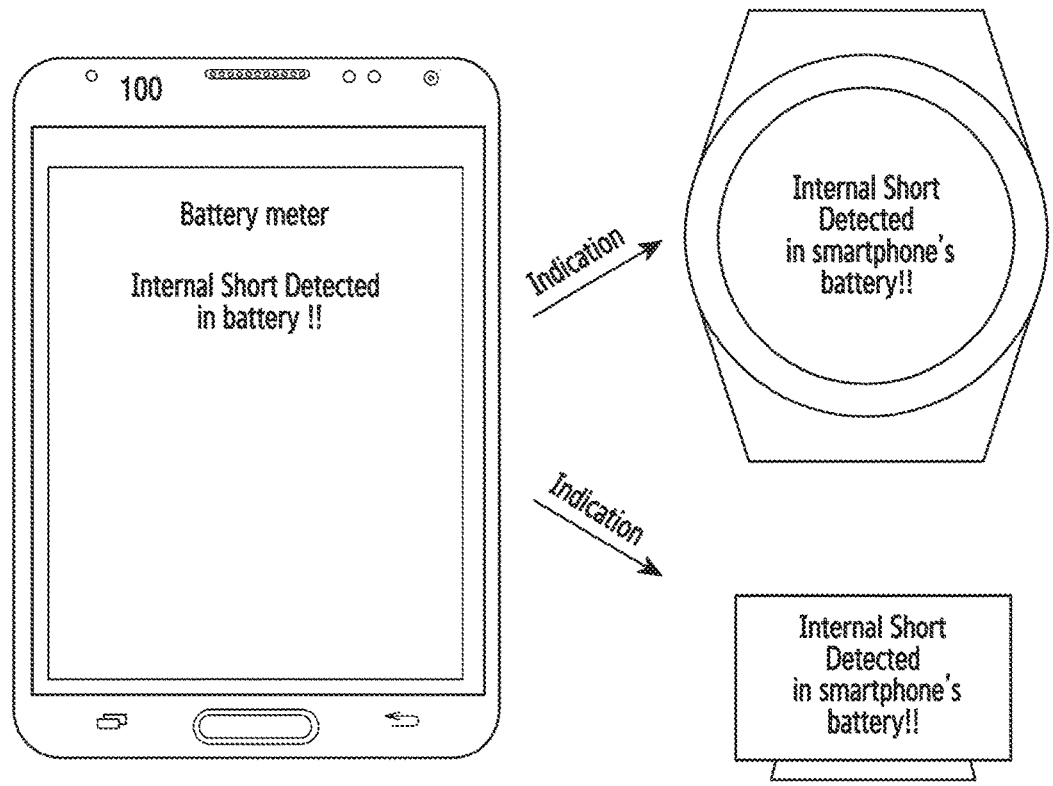

In another embodiment, as shown in the FIG. 5D, the electronic device 100 indicates the detected internal short circuit to the one or more connected devices of the user such as for e.g., a wearable device, a smart television or the like. For example, the electronic device 100 indicates the detected internal short circuit to the one or more connected devices through short range communication (SRC) technologies such as Bluetooth®, Wireless-Fidelity (Wi-Fi®), Near field communication (NFC) or the like.

Figure 5E:
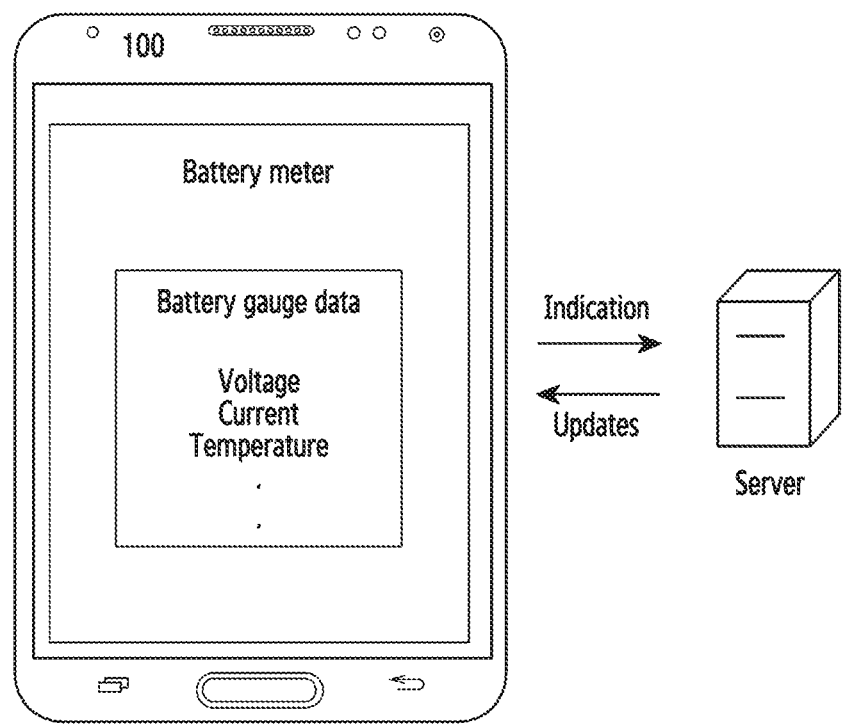

In another embodiment, the electronic device 100 indicates the battery gauge data periodically to a server as shown in the FIG. 5E. In some embodiments, the electronic device 100 can be configured to receive one or more updates to a battery application installed on the electronic device to ensure safe operation of the battery 110.

Figure 6:
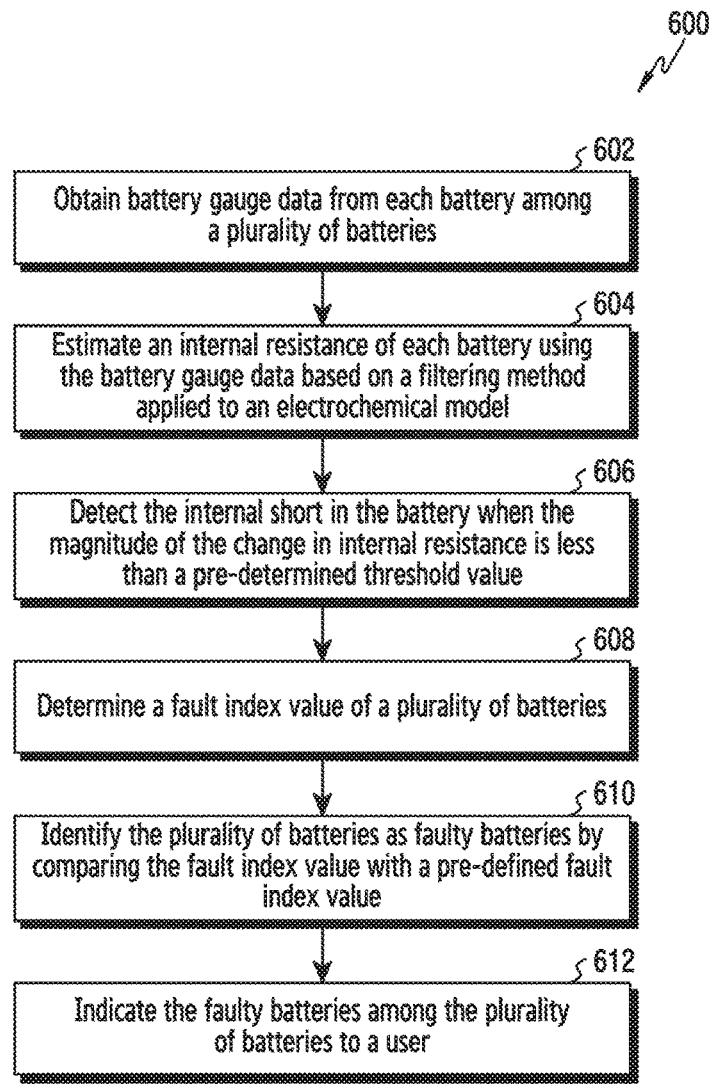
FIG. 6 is a flow chart illustrating a method for detecting internal short circuit for a plurality of batteries, according to an embodiment as disclosed herein.

FIG. 6 is a flow chart 600 illustrating a method for detecting internal short circuit for a plurality of batteries, according to an embodiment as disclosed herein. The flow chart 600 describes the various steps for testing the batteries in a batch to identify faulty batteries in the batch. The proposed method of internal short detection is performed on the batteries to identify the faulty batteries from the plurality of batteries.

Referring to the FIG. 6, at step 602, the method includes obtaining battery gauge data from each battery among a plurality of batteries. In an embodiment, the method allows the battery management system 130 to obtain the battery gauge data from each battery among a plurality of batteries.

At step 604, the method includes estimating the internal resistance of each battery using the battery gauge data based on a filtering technique applied to an electrochemical model. In an embodiment, the method allows the battery management system 130 to estimate the internal resistance of each battery using the battery gauge data based on a filtering technique applied to an electrochemical model.

At step 606, the method includes detecting the internal short in the battery when the magnitude of the change in internal resistance is less than a pre-determined threshold value. In an embodiment, the method allows the battery management system 130 to detect the internal short in the battery when the magnitude of the change in internal resistance is less than a pre-determined threshold value. In case at step 606, if the short is detected in the battery, at step 608, the method includes determining fault index value of the plurality of batteries. In an embodiment, the method allows the battery management system 130 to determine fault index value of the plurality of devices.

At step 610, the method includes identifying the plurality of batteries as faulty batteries by comparing the fault index value with the pre-defined fault index value. In an embodiment, the method allows the battery management system 130 to identify the plurality of batteries as faulty batteries by comparing the fault index value with a pre-defined fault index value. The battery management system 130 can be configured to determine whether the PPM of each battery is less than the pre-defined PPM value. In case, the battery management system 130 determines that the PPM of each battery is less than the pre-defined PPM value, then at step 612, the method includes indicating the identified faulty batteries to the user. In an embodiment, the method allows the battery management system 130 to indicate the identified faulty batteries to the user. For example, the electronic device 100 indicates the faulty batteries and various statistical data related to number of cycles between the fault detection and the battery failure. The user can reject the batch of batteries in case the faulty batteries are identified.

The various actions, acts, blocks, steps, or the like in the flow diagram 600 may be performed in the order presented, in a different order or simultaneously. Further, in some embodiments, some of the actions, acts, blocks, steps, or the like may be omitted, added, modified, skipped, or the like without departing from the scope of the invention.

FIGS. 7A-7D are graphs showing Haar transform of internal resistance, according to an embodiment as disclosed herein.

The internal resistance signal of the battery 110 is spectrally expanded as $$x(t)=\Sigma_{i=1}^{n}<x,H_i>H_i$$

Figure 7A:
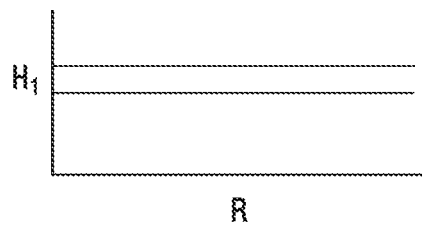
FIGS. 7A-7D are graphs showing Haar transform of internal resistance, according to an embodiment as disclosed herein.
Figure 7B:
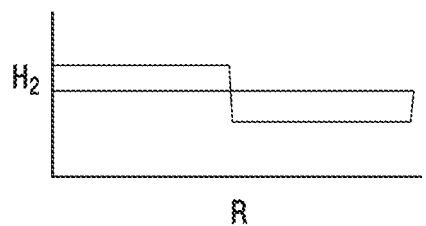
Figure 7C:
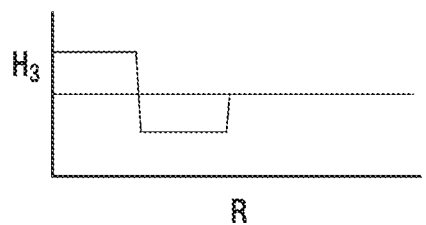
Figure 7D:
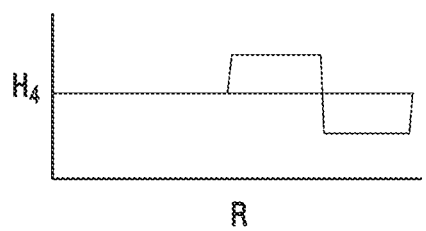

The battery management system 130 can be configured to apply the Haar transform on the internal resistance of the battery 110. The Haar transform localizes and magnifies the internal resistance signal. The coefficients of the Haar transform are obtained using a Fast Haar Transform. Peaks of the Haar transform coefficients are used for the internal short circuit detection in the battery 110. The various Haar transform coefficients with respect to the internal resistance of the battery are shown in the FIGS. 7A-7D. The peaks of the second Haar coefficient ($H_2$) of the internal resistance signal as shown in the FIG. 7B is analyzed to determine the internal short circuit in the battery.

Figure 8A:
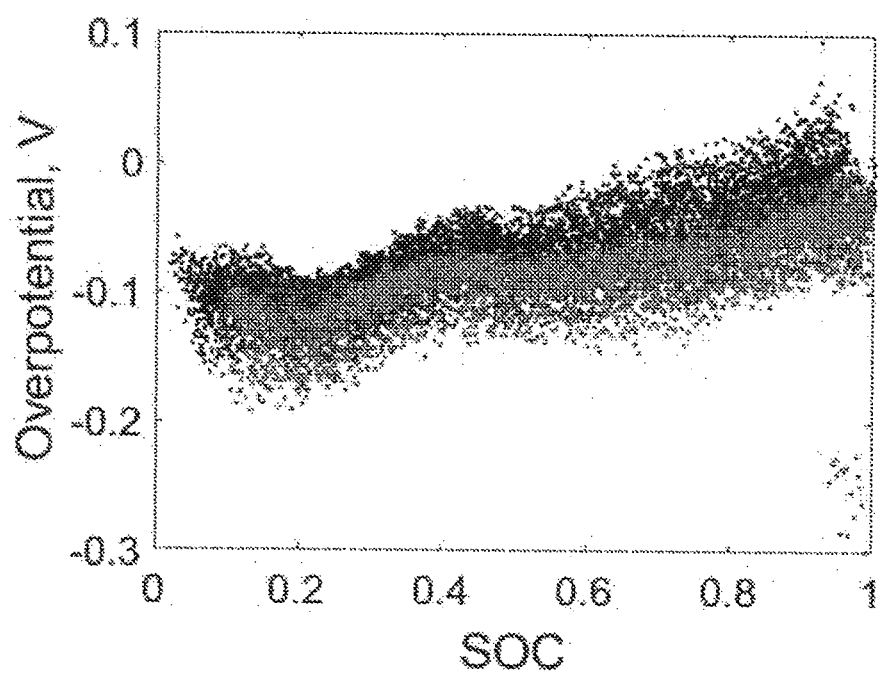
FIG. 8A is a graph showing variation of voltage for a normal battery and a faulty battery, according to an embodiment as disclosed herein.

FIG. 8A is a graph showing variation of voltage for a normal battery and a faulty battery, according to an embodiment as disclosed herein.

Referring to the FIG. 8A, for a given state of charge (SOC), over potential is represented as Vexp−Vocv. From the FIG. 8A, it should be noted that the magnitude of over-potential is higher during discharge for the faulty batteries compared to the normal batteries.

Figure 8B:
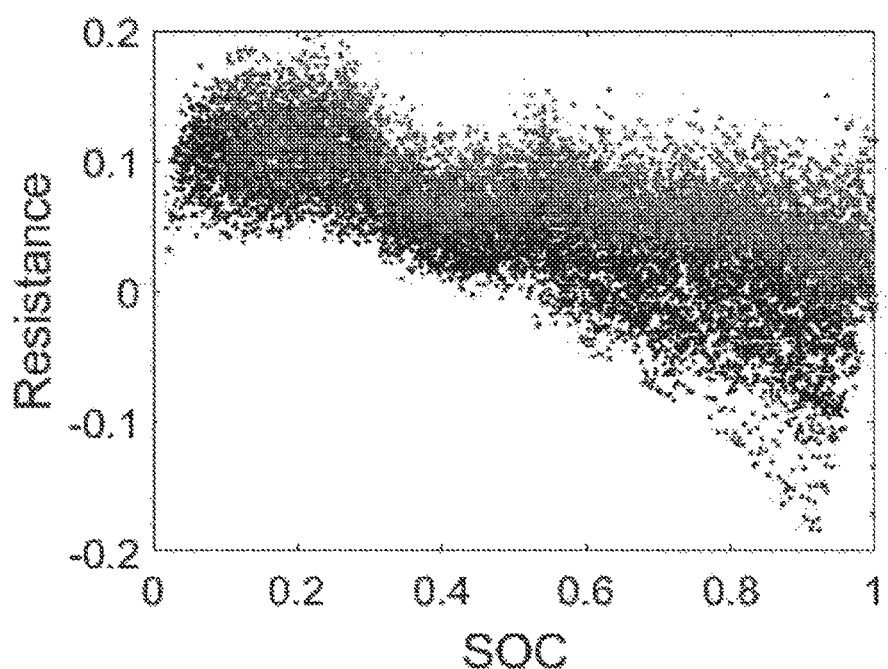
FIG. 8B is a graph showing the internal resistance of the normal battery and the faulty battery, according to an embodiment as disclosed herein.

FIG. 8B is a graph showing the internal resistance of the normal battery and the faulty battery, according to an embodiment as disclosed herein.

Referring to the FIG. 8B, for faulty batteries, the slope of the change in the internal resistance change during discharge is higher than the normal batteries.

Figure 8C:
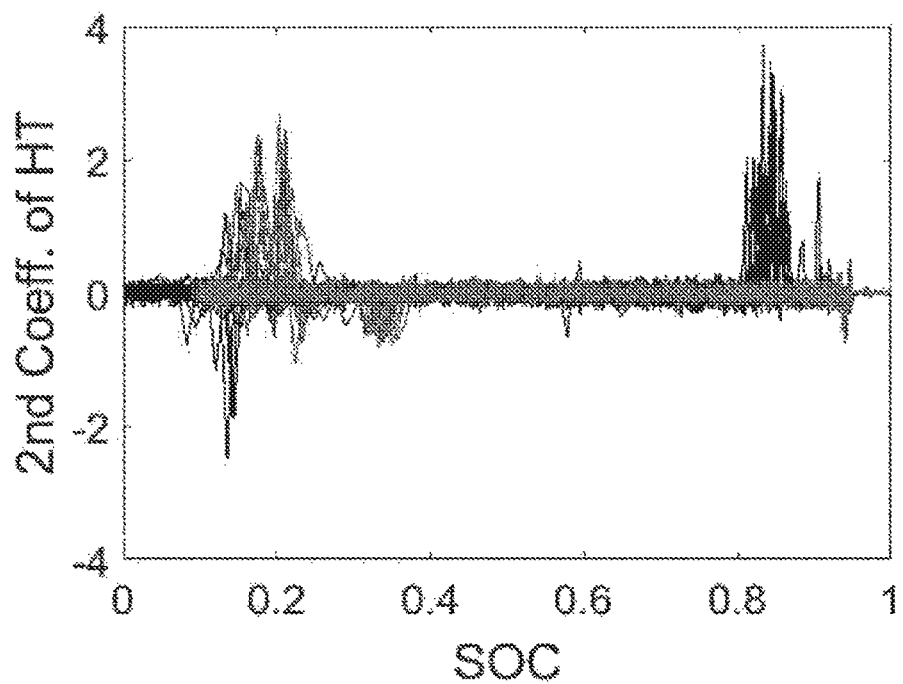
FIG. 8C is a graph showing a second Haar transform coefficient for the normal battery and the faulty battery, according to an embodiment as disclosed herein.

FIG. 8C is a graph showing a second Haar transform coefficient for the normal battery and the faulty battery, according to an embodiment as disclosed herein. From the FIG. 8C, it can be inferred that there are two peaks in the normal cells and one peak for the faulty cells. Further, it should be noted that the change in the internal resistance during charge-discharge transition is low for the faulty cells.

The embodiments disclosed herein can be implemented using at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

What is claimed is:

1. A method for operating an electronic device, the method comprising:
   acquiring at least one parameter associated with charging a battery;
   estimating an internal resistance of the battery using the at least one parameter;
   in response to a state of the battery being changed from charge to discharge, identifying change in magnitude of the internal resistance by applying a signal processing algorithm on the estimated internal resistance; and detecting an internal short circuit in the battery by comparing a value of the change in magnitude of the internal resistance with a threshold for a resistance change.

2. The method of claim 1, wherein detecting the internal short circuit in the battery comprises:
applying Haar transform on the estimated internal resistance to measure discontinuity in the internal resistance during a charge-discharge transition;
identifying a magnitude of change in the internal resistance based on the Haar transform; and
detecting the internal short circuit in the battery when the magnitude of the change in internal resistance is less than the threshold for the resistance change.

3. The method of claim 1, further comprising:
displaying a message indicating that the internal short circuit in the battery is detected; and
displaying an indicator to view details of the detected internal short circuit.

4. The method of claim 3, wherein the message comprises an alert message about failure of the battery.

5. The method of claim 3, wherein the message comprises a message for scheduling replacement of the battery and a message for indicating safety limit of charging the battery according to a minimum voltage.

6. The method of claim 1, further comprising:
acquiring at least one parameter for normal battery and faulty battery;
determining coefficients of the signal processing algorithm for the internal resistance based on the at least one parameter for normal battery and faulty battery; and
determining a ratio of coefficients for the normal battery and faulty battery as the threshold,
wherein the signal processing algorithm is used to identify the change in magnitude of the internal resistance.

7. The method of claim 1, further comprising:
transmitting an indication about the detected internal short circuit to at least one connected electronic devices of a user.

8. The method of claim 1, wherein the at least one parameter is stored periodically during charge-discharge transition for detecting the internal short circuit in the battery.

9. The method of claim 1, wherein the at least one parameter comprises at least one of voltage, current, temperature, total battery capacity, an internal impedance, a state of charge of the battery, a number of charging cycles, a number of discharging cycles, a discharge capacity, usage information of an electronic device that includes the battery, or usage information of each application installed in the electronic device.

10. A method for detecting an internal short circuit in a battery, the method comprising:
acquiring at least one parameter associated with charging a battery from each battery among a plurality of batteries;
estimating an internal resistance of each battery using the at least one parameter;
in response to a state of each battery being changed to discharge, identifying change in magnitude of the internal resistance by applying a signal processing algorithm on the estimated internal resistance;
detecting an internal short circuit in each battery by comparing a value of the change in magnitude of the internal resistance with a threshold for a resistance change;
determining a fault index value of the plurality of batteries; and
identifying the plurality of batteries as faulty batteries by comparing the fault index value with a pre-defined fault index value.

11. The method of claim 10, further comprising:
displaying a message indicating that the faulty batteries among the plurality of batteries are detected.

12. An electronic device comprising:
at least one processor configured to:
acquire at least one parameter associated with charging a battery,
estimate an internal resistance of the battery using the at least one parameter,
in response to a state of the battery being changed from charge to discharge,
identify change in magnitude of the internal resistance by applying a signal processing algorithm on the estimated internal resistance, and
detect an internal short circuit in the battery by comparing a value of the change in magnitude of the internal resistance with a threshold for a resistance change.

13. The electronic device of claim 12, wherein the at least one processor is further configured to:
apply a Haar transform on the estimated internal resistance to measure discontinuity in the internal resistance during a charge-discharge transition,
identify a magnitude of change in the internal resistance based on the Haar transform, and
detect the internal short circuit in the battery when the magnitude of the change in internal resistance is less than the threshold for the resistance change.

14. The electronic device of claim 12, wherein the at least one processor is further configured to:
display a message indicating that the internal short circuit in the battery is detected, and display an indicator to view details of the detected internal short circuit.

15. The electronic device of claim 14, wherein the message comprises an alert message about failure of the battery.

16. The electronic device of claim 14, wherein the message comprises a message for scheduling replacement of the battery and a message for indicating a safety limit of charging the battery according to a minimum voltage.

17. The electronic device of claim 14, wherein the at least one processor is further configured to:
acquire at least one parameter for normal battery and faulty battery,
determine coefficients of the signal processing algorithm for the internal resistance based on the at least one parameter for normal battery and faulty battery, and
determine a ratio of coefficients for the normal battery and faulty battery as the threshold,
wherein the signal processing algorithm is used to identify the change in magnitude of the internal resistance.

18. The electronic device of claim 12, wherein the at least one processor is further configured to indicate the detected internal short circuit by transmitting an indication about the detected internal short circuit to at least one connected electronic device of a user.

19. The electronic device of claim 12, wherein the at least one parameter is stored periodically during charge-discharge transition for detecting the internal short circuit in the battery.

20. The electronic device of claim 12, wherein the at least one parameter comprises at least one of voltage, current, temperature, total battery capacity, an internal impedance, a state of charge of the battery, a number of charging cycles, a number of discharging cycles, a discharge capacity, usage information of the electronic device, or usage information of each application installed in the electronic device.

* * * * *